United States Patent

[11] 3,571,720

[72] Inventor Anthony T. Heagney
Elmwood Park, Ill.
[21] Appl. No. 743,729
[22] Filed July 10, 1968
[45] Patented Mar. 23, 1971
[73] Assignee Motorola, Inc.
Franklin Park, Ill.

[54] SYSTEM FOR SELECTING ONE OF A PLURALITY OF CONTROL UNITS FOR TUNING A WAVE SIGNAL RECEIVER
10 Claims, 2 Drawing Figs.

[52] U.S. Cl. .......... 325/390, 325/416, 325/452, 325/465, 325/470
[51] Int. Cl. .......... H04b 1/06, H04b 1/16, H04b 1/32
[50] Field of Search .......... 325/390, 416, 452, 465, 470

[56] References Cited
UNITED STATES PATENTS

| | | | |
|---|---|---|---|
| 2,223,619 | 12/1940 | Kahn | 325/390 |
| 2,582,270 | 1/1952 | Olson | 325/390 |
| 3,189,829 | 6/1965 | Bento | 325/470 |
| 3,325,737 | 6/1967 | Berman | 325/470 |

*Primary Examiner*—Bernard Konick
*Assistant Examiner*—Howard W. Britton
*Attorney*—Mueller & Aichele

ABSTRACT: A system for establishing priority in one of a plurality of remote control units used for tuning a radio by varying the bias on voltage variable capacitors in the antenna, RF and local oscillator stages. Each remote control unit includes a semiconductor switching circuit connected between a momentary pushbutton switch and a potentiometer calibrated to the radiofrequency band. Actuating the pushbutton switch of one unit energizes the switching circuit of that unit to couple a potential through the potentiometer to the control unit. The pushbutton also connects a potential to the switching circuits of the remaining control units to deenergize them.

INVENTOR.
ANTHONY T. HEAGNEY
BY Mueller, Aichele & Rauner
ATTORNEYS.

INVENTOR.
ANTHONY T. HEAGNEY

BY Mueller, Aichele & Rauner
ATTORNEYS.

SYSTEM FOR SELECTING ONE OF A PLURALITY OF CONTROL UNITS FOR TUNING A WAVE SIGNAL RECEIVER

BACKGROUND OF THE INVENTION

This invention pertains generally to electronic tuning of a wave signal device and more particularly to a system for establishing priority in a plurality of control units used to electronically tune a wave signal receiver.

It has been proposed to electronically tune a radio receiver by using a potentiometer to vary a direct-current bias on voltage variable capacitors in the tuned circuit stages of the receiver. One such tuning system is described in U.S. Pat. application Ser. No. 721,716, filed Apr. 16, 1968, and assigned to the assignee of this application. Electronic tuning lends itself nicely to the use of remote tuning stations for tuning a car radio. For instance, such remote stations could be positioned in the armrest on the doors in the front and back seat. In order to made such a system operable, it follows that some type of priority must be established so that only one remote control unit can be used at any given time.

Furthermore, in order to made electronically tuned radios commercially acceptable to the consumer, it is desirable to provide these radios with features with which the consumer is familiar. One such feature is the capability of pushbutton tuning.

SUMMARY

It is one object of this invention to provide a system for establishing priority in a plurality of control units each of which selectively apply a predeterminable potential to circuitry for electronically tuning wave signal apparatus.

It is another object of this invention to provide a system for selecting one of a plurality of remote control units each of which selectively apply a bias potential to a voltage variable capacitor connected in a tuned circuit stage of a wave signal receiver for tuning the circuit through a range of frequencies.

It is a further object of this application to provide pushbutton operation for an electronically tuned wave signal receiver.

In one embodiment of this invention voltage variable capacitors are positioned in the tuned circuits of the antenna. RF amplifier and local oscillator stages. A plurality of control units are provided which are operable to apply a variable DC potential to the voltage variable capacitors through a potentiometer, the settings of which are calibrated to the radio frequency band, thereby tuning the tuned circuits of the radio receiver to a desired frequency electronically. A system for establishing priority in one of the plurality of control units includes a semiconductor switching circuit in each unit connected between a momentary pushbutton switch and the potentiometer. Actuating the momentary switch in one control unit energizes the switching circuit therein to couple a potential through the potentiometer to the voltage variable capacitors. The momentary switch also connects a potential to the switching circuits of the remaining control units which operates the same to deenergize the units thereby establishing priority in the selected control unit.

A further embodiment of the invention includes positioning a plurality of control units adjacent to one another to provide pushbutton operation for the wave signal receiver. Each pushbutton acts as a momentary switch to energize the semiconductor switching circuit associated therewith to couple a potential, determined by a predetermined setting of the potentiometer, to the voltage variable capacitors for tuning the wave signal receiver to a preselected frequency. Besides the five pushbuttons normally associated with the radio, an additional control unit having a momentary button is provided for manual control. Operation of this button takes priority for tuning the radio from the pushbuttons and gives it to the manual control.

DETAILED DESCRIPTION

Figure 1:
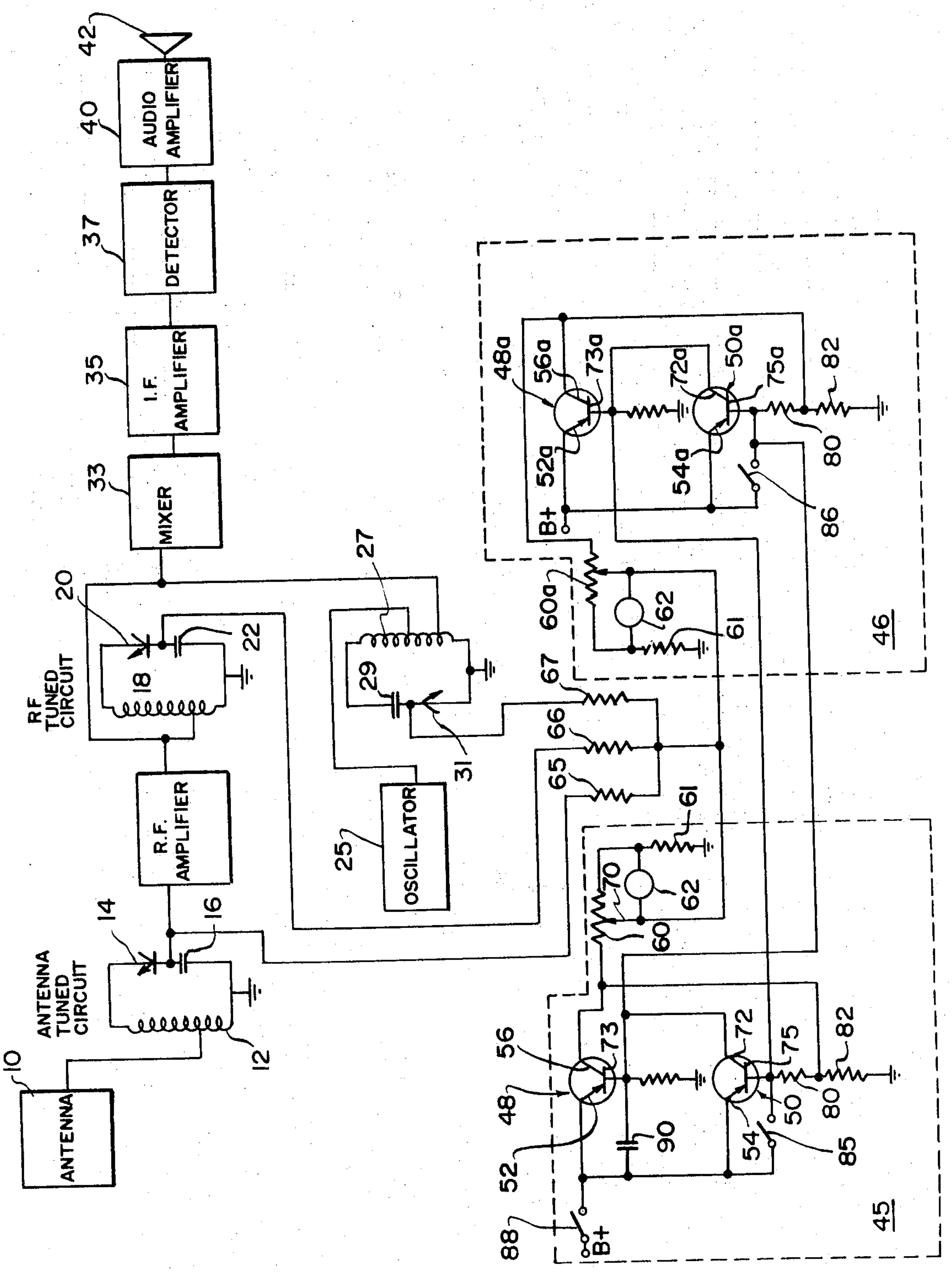
FIG. 1 is a combination schematic wiring and block diagram illustrating an electronically tuned radio having remote control units in accordance with this invention.

Referring to the wave signal receiver shown in FIG. 1 of the drawing, signals appearing at the antenna 10 are connected to an impedance-matching point on the primary winding 12 of the antenna-tuned circuit, which includes a blocking capacitor 16 and a voltage variable capacitor or reactance device 14. A voltage variable capacitor is a two-terminal, PN junction semiconductor device which exhibits a change in capacitance proportional to a change in direct-current bias across the device. By varying the direct-current bias on the voltage variable capacitor 14, the antenna 10 can be turned through a predetermined radio frequency range.

The received signal is coupled to an RF amplifier, where it is amplified and connected to an impedance-matching point on the primary winding 18 of the RF tuned circuit, which includes voltage variable capacitor 20 and blocking capacitor 22. The radio frequency signals are heterodyned in a converter comprising a local oscillator 25, signals from which are connected to an impedance-matching point on the primary winding 27 on the oscillator tuned circuit, which includes blocking capacitor 29 and voltage variable capacitor 31. The tuned signal from the local oscillator is combined with the RF signal in the mixer 33, resulting in an intermediate frequency signal that is amplified in the IF amplifier 35. The signal from the IF amplifier 35 is detected by detector 37 and coupled to an audio amplifier 40 which drives the speaker 42.

Also shown in FIG. 1 are two control devices 45 and 46, which are used to vary the direct-current bias potential on the voltage variable capacitors 14, 20 and 31. One or more of these control devices can be located at the radio receiver, or more conveniently can be positioned as control units remotely located from the radio receiver. In radios for use in automobiles, for instance, the remote control units provide for versatile electronic tuning of the radio. For instance, one of the units can be positioned in an armrest in the front seat adjacent to the driver and another in an arm rest in the back seat for the convenience of passengers riding there. It is one of the unique concepts of this invention to provide a system for establishing priority in the control units to prevent the possibility of two control units tuning the radio at the same time.

A description will be given for control unit 45, and for convenience like elements will be given similar numbers for control unit 46.

Control unit 45 includes a semiconductor switching circuit comprising PNP transistors 48 and 50. A direct current bias potential is connected from the switch 88 to the emitter or input electrodes 52 and 54, respectively of transistors 48 and 50. The collector or output electrode 56 of transistor 48 is connected to the potentiometer 60 and through resistor 61 to ground reference potential. Milliamp meter 62 is connected across potentiometer 60 and is calibrated to indicate the frequency to which the radio is tuned. Therefore, when transistor 48 is conducting, a direct-current potential will be connected to the potentiometer 60. The direct-current bias potential is connected from the potentiometer 60 by the resistors 65, 66 and 67 to the voltage variable capacitors 14, 20 and 31, respectively to tune the antenna, RF amplifier and local oscillator stages to the desired frequency. By varying the arm 70 of the potentiometer 60 manually, through a knob, for instance, the bias on the voltage variable capacitors is changed thereby making it possible to tune the radio through a wide range of frequencies.

The collector 72 of the transistor 50 is connected to the base or control electrode 73 of the transistor 48, and the base or control electrode 75 of the transistor 50 is connected to the base or control electrode 73a of the transistor 48a in control unit 46. The collector or output electrode 56 of transistor 48 is connected to a voltage divider formed by resistors 80 and 82, which provide bias for the control electrode 75 of the transistor 50. Momentary pushbutton-type switches 85 and 86 are connected between the direct-current potential and the respective control electrodes 75 and 75a of the transistors 50 and 50a. Each of the momentary switches 85 and 86 is also connected to the control electrodes 73a and 73, respectively of the transistors 48 and 48a.

In operation the switch 88 is initially closed to energize the radio. This couples a potential through the capacitor 90 to the base of transistor 48 biasing off that transistor. The pulse is also applied to the base of transistor 50a biasing off that transistor. With transistor 50a turned off, the transistor 48a will be biased into conduction. Conduction of transistor 48a applies a potential to potentiometer 60a thereby establishing tuning control of the radio in the control unit 46. With transistor 48a conducting and transistor 48 biased off, the transistor 50, with the charging of capacitor 90, commences to conduct.

Tuning control is established in the unit 45 by momentarily closing switch 85, which applies a potential to the base electrode 75 of transistor 50 biasing that transistor off, and also applies a potential to the base 73a of transistor 48a biasing that transistor off such that the potentiometer 60a is no longer providing bias to the voltage variable capacitor. When transistor 48a is biased off, transistor 50a commences to conduct and expedites the switching off of transistor 48a. When transistor 50 is biased off, the potential on base 73 of transistor 48 is reduced and transistor 48 commences to conduct applying a potential to potentiometer 60. A direct-current bias potential is connected from the potentiometer 60 by resistors 65—67 to the voltage variable capacitors for tuning the same. When control of tuning is desired in unit 46, one simply closes the momentary switch 86 and the process previously described is reversed.

It can be seen that the capacitor 90 cooperates with the switch 88 to provide a priority circuit so that when the radio is initially energized with the closing of switch 88, control of tuning will always be initially given to unit 46.

Figure 2:
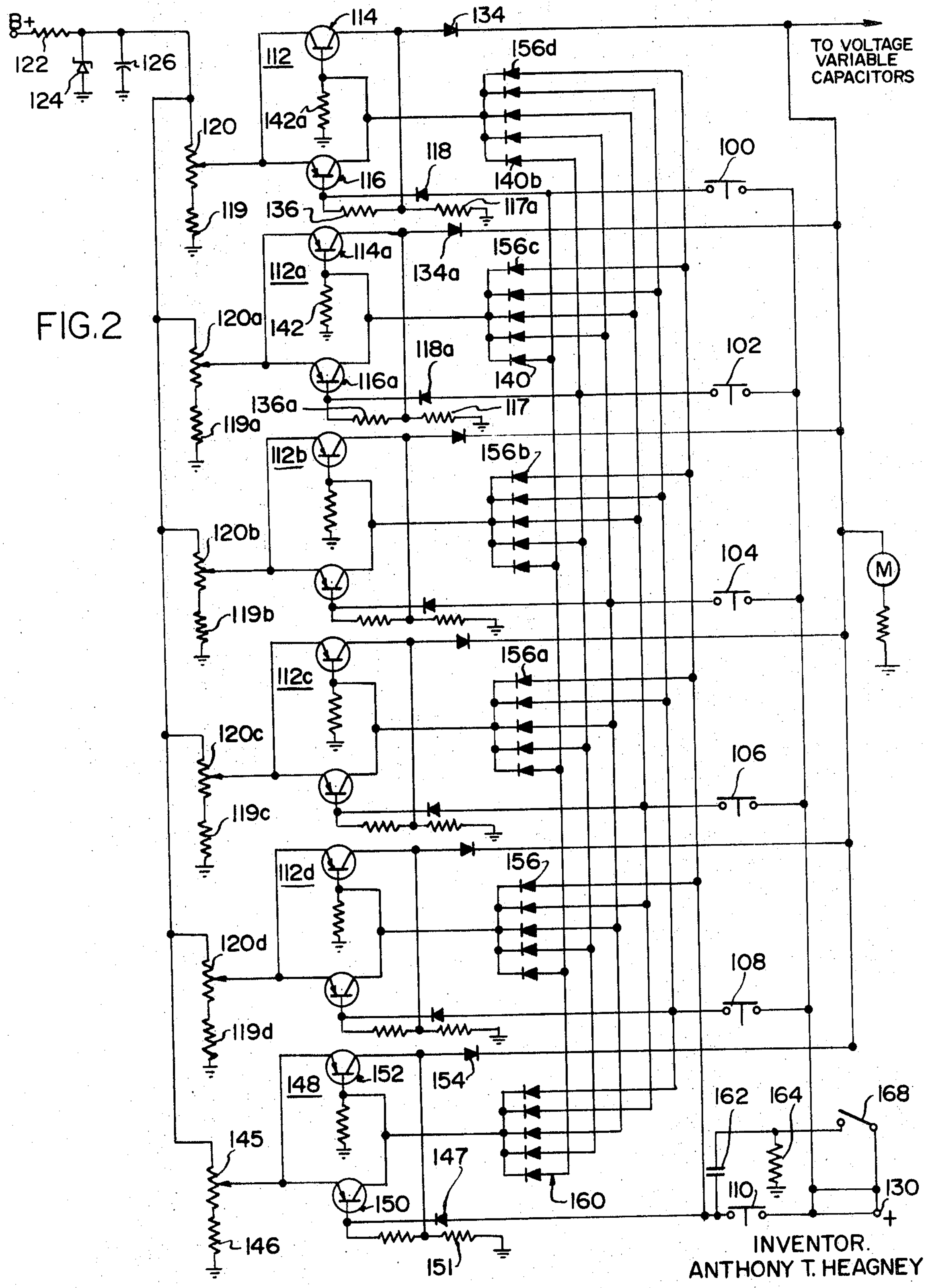
FIG. 2 is a schematic wiring diagram illustrating a pushbutton system for use with an electronically tuned radio, in accordance with the principles of this invention.

Referring to FIG. 2 there is shown an embodiment of the invention wherein a series of control units are combined to provide electronic pushbutton tuning of the radio of FIG. 1. Essentially, the pushbutton tuner includes momentary pushbutton switches 100, 102, 104, 106 and 108. Momentary switch 110 is used for manual tuning of the radio and will be described subsequently. The operation and circuitry of each of the pushbuttons is similar and for simplicity sake this discussion will be directed to the inner action of two of the pushbuttons. It should be understood that operation of the remaining pushbuttons is the same.

Momentary pushbutton 100 is coupled to a semiconductor switch 112 comprising the PNP transistors 114 and 116 by diode 118. Semiconductor switch 112 is connected through potentiometer 120 and resistor 122 to B+ power supply. The Zener diode 124 provides a regulated B+ potential to the potentiometer 120, and the capacitor 126 filters out any line ripple. The potentiometers 120 and 120a associated with pushbuttons 100 and 102 are manually preset to a position which will provide a direct-current bias on the voltage variable capacitors in the tuned circuits of the radio in FIG. 1 corresponding to the frequency of a desired broadcasting station. The resistors 119 and 119a in series with potentiometers 120 and 120a insure that the potential applied to the emitters of transistors 116 and 116a is always greater than the 0.6 volts needed to drive these transistors into conduction.

In operation, momentarily engaging the pushbutton 100 couples a potential from direct-current source 130 through diode 118 to the base or control electrode of transistor 116 biasing off that transistor. With transistor 116 cut off the potential on the base of transistor 114 is reduced, and transistor 114 commences to conduct coupling a potential across the potentiometer 120 through diode 134 to the voltage variable capacitors. The potential on the collector of transistor 114 is coupled by the resistor 136 to the base of transistor 116 which reverse biases transistor 116 and keeps it turned off while transistor 114 is conducting. Simultaneously, a potential is coupled through the switch 100 and diode 140 across base bias resistor 142 thereby applying a potential to the control electrode of PNP transistor 114a and biasing that transistor out of conduction. As can be seen, this potential from the pushbutton switch 100 is coupled to the remaining semiconductor switches 112b—d to bias them off such that only the potentiometer 120, associated with pushbutton 100, controls the tuning of the radio receiver. When transistor 114a is biased off transistor 116a conducts. The resistor 117 in series with resistor 136a limits the emitter-to-base current coupled to ground reference potential so that the potential determined by the voltage divider formed by resistors 136a and 117 and the resistance 121 in series with the meter cannot exceed the lowest control voltage applied to the varicaps by the selected pushbutton.

If the broadcast station associated with pushbutton 102 is desired to be heard by the operator, he momentarily closes this switch, coupling a potential to the control or base electrode of transistor 116a biasing that transistor off and gating on transistor 114a. Subsequently, the potential across potentiometer 120a is coupled by transistor 114a through the diode 134a to change the direct-current bias on the voltage variable capacitors in the radio receiver thereby tuning the receiver to a new station. The potential through switch 102 is also coupled through diode 140b of pushbutton switch 100 to bias off the transistor 114 of the semiconductor switch 112 thereby driving transistor 116 into conduction. Conduction of transistor 116 insures that transistor 114 remains off once the momentary switch 102 is opened. It is believed clear from the foregoing discussion that momentarily closing one of the pushbuttons 104, 106 and 108 will act in the manner described to give control of the tuning to the potentiometer of the selected switch and to deenergize the remaining pushbuttons.

As with conventional pushbutton radios, it is desirable to have manual tuning. This is provided by the momentary switch 110. Potentiometer 145, the arm of which is, for instance, manually positioned by a knob similar to the manual control knob of a conventional tuner, changes the bias on the voltage variable capacitors to tune the radio through the broadcast band. The momentary switch 110 associated with the manual tuning potentiometer 145 is coupled thereto through diode 147 and semiconductor switching circuit 148. Momentarily engaging the switch 110 couples a direct-current potential from source 130 through the switch and diode 147 to the base electrode of PNP transistor 150 biasing that transistor off and energizing transistor 152. With transistor 152 conducting, the predetermined potential across potentiometer 145 is coupled through the diode 154 to the voltage variable capacitors of the radio receiver. Engagement of the button 110 also couples the potential from the source 130 through the diodes 156 and 156a—d to bias off the respective semiconductor switching circuits 112 thereby taking away tuning of the radio from the pushbuttons. Of course, engaging any of the pushbuttons will likewise couple a potential through the diode bank 160 to bias off transistor 152 thereby taking away priority from the manual tuning. The resistors 146 and 151 provide the functions described for resistors 119 and 117, respectively.

A priority circuit comprising a capacitor 162 across which a resistor 164 is connected is used to initially set the radio for manual tuning, when the on-off switch 168 is closed to initially energize the radio. In operation, closing the switch 168 momentarily applies a pulse from the direct-current source 130 through capacitor 162 and diode 147 to bias off transistor 150 and hence energize transistor 152 to couple the bias from potentiometer 145 to the voltage variable capacitors of the radio receiver. The pulse also serves to deenergize the semiconductor switches of the pushbuttons. Subsequently, the capacitor 162 charges up to the potential source 130. Priority may be taken from the manual tuning system any time thereafter by momentarily engaging one of the pushbuttons. If manual tuning is then desired after a pushbutton has been used, one simply has to engage the momentary button 110 and priority will be returned to the manual control. Upon deenergizing the radio, the capacitor 162 discharges through the resistor 164 to prepare the priority circuit for the next operation of the radio.

What has been described, therefore, is a system that establishes priority in a plurality of control units each of which selectively apply a bias potential to a voltage variable capacitor connected in a tuned circuit stage of a wave signal receiver for tuning the receiver through a range of frequencies. The control units can be remotely located, or positioned adjacent one another to provide pushbutton operation of the radio.

I claim:

1. A system for establishing priority in a plurality of control units and for electronically tuning wave signal apparatus from the selected unit, including in combination, electron control means in each control unit, circuit means connecting said electron control means to the tuning circuitry of the wave signal receiver, a plurality of switches each for respectively coupling a predetermined control potential to said electron control means for selectively tuning the wave signal apparatus, one of said switches of a selected control unit being operated to couple a control potential to said electron control means of the selected unit to operate the same thereby applying said predetermined potential to the circuitry of the wave signal receiver for tuning the same, said selected switch further applying a potential to said electron control means of the remaining control units operating the same so that only the selected control unit determines the tuning of the wave signal receiver.

2. The system of claim 1 further including, circuit means responsive to the energizing of the wave signal apparatus to couple a control potential to a preselected electron control means to energize the control unit associated therewith for tuning the wave signal apparatus, said circuit means further acting to couple a potential to the remaining electron control means to deenergize the control units associated therewith thereby always establishing priority in the preselected control unit with the initial energizing of the wave signal apparatus.

3. The system of claim 1 wherein each said switch is a momentary pushbutton switch connected between a respective electronic control means and a potential source.

4. A system for selecting one of a plurality of remote control units, each of which selectively apply a bias potential to a voltage variable capacitor connected in a tuned circuit stage of a wave signal receiver for tuning the circuit through a range of frequencies, the system including in combination, a plurality of remote control units, switching circuit means in each said control unit, means connecting said switching circuit means to the voltage variable capacitor, momentary switch means connected to said switching circuit means, said momentary switch means being selectively energized to couple a potential to said switching circuit means associated therewith to operate the same, said switching circuit means being operated to couple a bias potential to the voltage variable capacitor, and said selected momentary switch means further coupling a potential to the switching circuit means of the remaining control units to render the same inoperative thereby establishing tuning of the wave signal receiver with the selected control unit.

5. The system of claim 4 further including initial selector circuit means connected to said switching circuit means, said initial selector circuit means being responsive to the energizing of the wave signal receiver to couple a potential to a predetermined switching circuit means to operate the same, said initial selector circuit means further connecting a potential to the remaining switching circuit means to render the same inoperative thereby initially establishing tuning of the wave signal receiver with the control unit of said predetermined switching circuit means.

6. The system of claim 4 wherein said remote control unit includes a potentiometer for varying the voltage on the voltage variable capacitor and a meter responsive to the voltage on the voltage variable capacitor for indicating the frequency to which the wave signal receiver is tuned, each of said switching circuit means includes first and second transistors having input, output and control electrodes, the output electrode of said first transistor being connected to the control electrode of said second transistor, and the output electrode of said second transistor being coupled to said potentiometer, and said momentary switch means being coupled to the control electrode of said first transistor and to the control electrode of said second transistor of each of the switching circuit means of the other remote control units, and the input electrodes of each transistor is connected to a direct-current potential whereby said momentary switching means of the selected remote control unit is actuated to connect a potential to the control electrode of said first transistor thereby energizing said second transistor to connect a potential to said potentiometer, and said momentary switch means further connects a potential to the control electrode of said second transistor of each of the switching circuit means of the other remote control units to deenergize the potentiometers connected to the output electrodes thereof thereby establishing priority in the selected control unit.

7. A pushbutton-type wave signal receiver having a signal-processing stage including a voltage variable capacitor responsive to a variable direct-current bias for tuning the stage through a range of frequencies, including in combination, a plurality of pushbutton switches, switching circuit means connected to each of said pushbutton switches, potentiometer means connected between said switching circuit means and the voltage variable capacitor for coupling a predetermined bias potential thereto to tune the signal-processing stage to a given frequency, whereby operation of a selected pushbutton actuates said switching circuit means connected thereto to apply a direct-current potential to the associated potentiometer means for tuning the signal-processing stage to a predetermined frequency, said pushbutton further acting to apply a potential to the switching circuit means of the remaining pushbuttons to deenergize the same thereby establishing tuning of the wave signal receiver with only the selected pushbutton.

8. The wave signal receiver of claim 7 further including a control for manually varying the direct-current bias potential on the voltage variable capacitor to tune the stage through a range of frequencies, said control including a momentary switch, switching circuit means connected to said momentary switch, and potentiometer means connected between said switching circuit means and the voltage variable capacitor, said potentiometer means being varied selectively to apply a bias potential to the voltage variable capacitor for tuning the signal-processing stage, whereby operating said momentary switch energizes said switching circuit means which couples a direct-current potential to said potentiometer means for tuning the signal-processing stage through the range of frequencies, said momentary switch further applying a potential to the switching circuit means of said pushbuttons to deenergize the same thereby establishing tuning of the wave signal receiver with said manual control.

9. The wave signal receiver of claim 8 further including a switch for initially energizing the receiver, and priority circuit means connected between said switch and said switching circuit means of said pushbuttons and said momentary switch, whereby said priority circuit means is responsive to the operating of said switch to energize the receiver to couple a potential to said switching circuit means of said momentary switch to energize the same to establish tuning with said manual control, and said priority circuit means further coupling a potential to said switching circuit means of said pushbuttons to deenergize the same thereby establishing tuning of the wave signal receiver with said manual control with initial energizing of the receiver.

10. The wave signal receiver of claim 9 wherein said priority circuit means includes a capacitor connected between said switch and said switching circuit means, said capacitor initially coupling a potential to said switching circuit with the energizing of the receiver, and a resistor connected across said capacitor for discharging the same with the opening of said switch with the receiver being deenergized.